US012050298B1

(12) United States Patent
Lin et al.

(10) Patent No.: US 12,050,298 B1
(45) Date of Patent: Jul. 30, 2024

(54) METHOD AND SYSTEM FOR EVALUATING CASUALTY CAUSED BY LANDSLIDE CHAIN DISASTER INDUCED BY HEAVY RAIN

(71) Applicant: Nanjing University of Information Science & Technology, Nanjing (CN)

(72) Inventors: Qigen Lin, Nanjing (CN); Tong Jiang, Nanjing (CN); Jianqing Zhai, Beijing (CN); Qingchen Chao, Beijing (CN); Jian Zhou, Nanjing (CN); Bingwei Wang, Nanjing (CN); Cheng Jing, Nanjing (CN)

(73) Assignee: Nanjing University of Information Science & Technology, Nanjing (CN)

(*) Notice: Subject to any disclaimer, the term of this patent is extended or adjusted under 35 U.S.C. 154(b) by 0 days.

(21) Appl. No.: 18/486,173

(22) Filed: Oct. 13, 2023

(30) Foreign Application Priority Data

May 16, 2023 (CN) .......................... 202310549062.7

(51) Int. Cl.
*G06F 30/20* (2020.01)
*G01V 20/00* (2024.01)
(52) U.S. Cl.
CPC .............. *G01V 20/00* (2024.01); *G06F 30/20* (2020.01)
(58) Field of Classification Search
CPC .................................................. G01V 99/005

USPC ....................................................... 703/6, 14
See application file for complete search history.

(56) References Cited

U.S. PATENT DOCUMENTS

| 2005/0100872 | A1* | 5/2005 | Hoster | G09B 23/30 434/262 |
| 2013/0110399 | A1* | 5/2013 | Moss | G01W 1/10 702/3 |
| 2019/0122150 | A1* | 4/2019 | Treboniak | G06Q 10/06398 |
| 2020/0293964 | A1* | 9/2020 | Billeter | G06Q 10/067 |

* cited by examiner

*Primary Examiner* — Andre Pierre Louis

(57) ABSTRACT

A method and system for evaluating casualty caused by landslide chain disaster induced by heavy rain are provided. The method includes: obtaining historical landslide data, candidate influence factors and personnel traffic distribution data of an observation site; dividing the historical landslide data into a model construction sample group, a model verification sample group, and a model test sample group; obtaining an occurrence probability of landslide chain disaster of each spatial position in the observation site; determining a start-up landslide source region of the landslide chain disaster according to the model verification sample group and the occurrence probability; determining an affected region of the landslide chain disaster according to the start-up landslide source region; determining a personnel number exposed to the landslide chain disaster; and setting an event division threshold, and evaluating the number of casualties according to the event division threshold and the personnel number.

11 Claims, 2 Drawing Sheets

METHOD AND SYSTEM FOR EVALUATING CASUALTY CAUSED BY LANDSLIDE CHAIN DISASTER INDUCED BY HEAVY RAIN

TECHNICAL FIELD

The disclosure relates to the technical field of early warning of meteorological disaster, particularly to a method and system for evaluating casualty caused by landslide chain disaster induced by heavy rain.

BACKGROUND

Landslide has become the second largest natural disaster after earthquake, and is also one of the main types of geological disasters in China. Investigation data show that 90% of landslide is induced by rainfall, and rainfall-type landslide has become one of the important disasters affecting human life, especially the landslide chain disaster induced by heavy rain (the corresponding precipitation is 50-99.9 millimeters every 24 hours). Every year, a large number of people are injured or killed because of the landslide chain disaster induced by heavy rain. In order to protect people's life, health, and property safety, it is required to effectively predict the landslide chain disaster induced by heavy rain.

In the related art, there are two main methods for the prediction of the number of casualties caused by landslide chain disaster induced by heavy rain. For a first method of the two main methods, the number of casualties is estimated based on historical experience and landslide risk assessment results; and for a second method of the two main methods, the number of casualties is estimated based on a predicted landslide affected region and personnel distribution data in the predicted landslide affected region. However, the first method does not take into account personnel traffic situation and personnel distribution data in a landslide region in different periods, so the estimated number of casualties is not very reference, and the first method is impossible to effectively predict the number of landslide deaths. In addition, although the second method takes into account the personnel distribution data in the landslide region, it only considers a starting point of landslide when predicting the landslide affected region. However, an actual spatial extent impacted by the landslide cannot be accurately obtained through only predicting the occur of landslide or determining the starting point of landslide, so the possible number of casualties after the landslide cannot be accurately obtained by using the second method. Therefore, the second method is particularly unfavorable to the prevention of landslide in heavy rainfall, and cannot reduce the losses caused by landslide and ensure people's lives, health and safety.

SUMMARY

A first objective of the disclosure is to provide a high-accuracy and reliable method for evaluating casualty caused by landslide chain disaster induced by heavy rain; and a second objective of the disclosure is to provide a high-accuracy and reliable system for evaluating casualty caused by landslide chain disaster induced by heavy rain.

In a first aspect, a method for evaluating casualty caused by landslide chain disaster induced by heavy rain is provided, which includes:

obtaining historical landslide data, candidate influence factors and personnel traffic distribution data of an observation site;

dividing the historical landslide data into a model construction sample group, a model verification sample group, and a model test sample group;

obtaining an occurrence probability of landslide chain disaster induced by heavy rain of each of spatial positions in the observation site according to the model construction sample group, the model verification sample group and the candidate influence factors;

determining a start-up landslide source region of the landslide chain disaster according to the model verification sample group and the occurrence probability of landslide chain disaster induced by heavy rain of each of the spatial positions in the observation site;

determining an affected region of the landslide chain disaster in the observation site according to the start-up landslide source region of the landslide chain disaster;

determining a personnel number exposed to the landslide chain disaster according to the affected region of the landslide chain disaster and the personnel traffic distribution data; and setting an event division threshold, and evaluating the number of casualties caused by the landslide chain disaster according to the event division threshold and the personnel number exposed to the landslide chain disaster.

In an embodiment, the candidate influence factors include a terrain slope, a terrain relief amplitude, a terrain curvature, a terrain position, a terrain humidity index, a heavy rain spatial distribution, a lithology type, a soil type, a vegetation coverage, a water system density, and a road density; and the obtaining an occurrence probability of landslide chain disaster induced by heavy rain of each of spatial positions in the observation site according to the model construction sample group, the model verification sample group and the candidate influence factors includes:

obtaining landslide source regions of landslide regions of the model construction sample group;

constructing a landslide start-up probability model according to the landslide source regions and the candidate influence factors; and determining the occurrence probability of landslide chain disaster induced by heavy rain of each of the spatial positions in the observation site according to the landslide start-up probability model.

In an embodiment, the obtaining landslide source regions of landslide regions of the model construction sample group includes: determining shapes and topographic features of the landslide regions; and determining the landslide source regions according to the shapes and the topographic features of the landslide regions.

In an embodiment, the constructing a landslide start-up probability model according to the landslide source regions and the candidate influence factors includes:

determining an Euclidean distance between a target landslide sample group (i.e., the model verification sample group) and the model construction sample group to obtain a plurality of neighboring data, and a formula of the Euclidean distance is expressed as follows:

$$\|x-y\| = \sqrt{\frac{\sum_{i=1}^{L}(x_i - y_i)^2}{L}},$$

where $\|x-y\|$ represents the Euclidean distance, L represents a total number of landslide samples of the model construction sample group, $x_i$ represents an i-th target landslide sample of the target landslide sample group, and y represents an i-th landslide sample of the model construction sample group;

determining a neighboring distance between the target landslide sample group and the plurality of neighboring data, where the neighboring distance is expressed as follows:

$$D=[D_1, D_2, \ldots, D_n],$$

where D represents the neighboring distance, $D_1$ represents an Euclidean distance between a first model verification sample of the model verification sample group and the model construction sample group, $D_2$ represents an Euclidean distance between a second model verification sample of the model verification sample group and the model construction sample group, and $D_n$ represents an Euclidean distance between an n-th model verification sample of the model verification sample group and the model construction sample group;

determining a weight of each landslide sample of the model construction sample group to the target landslide sample group is determined according to the neighboring distance, where a formula of the weight is expressed as follows:

$$w_i = 1 - (D_i - \min(D)), i=1, 2, \ldots, n,$$

where $w_i$ represents the weight, and $D_i$ represents an i-th neighboring distance;

constructing fuzzy reasoning criterions according to the weight of each landslide sample to the target landslide sample group; and constructing the landslide start-up probability model according to the fuzzy reasoning criterions, where a formula of the landslide start-up probability model is expressed as follows:

$$f(x_i) = \frac{\sum_{J=1}^{M} \sum_{i=0}^{N} b_{Ji} x_i \prod_{j=1}^{N} a_{Jj} \exp\left[\frac{(x_{ij} - m_{Jj})^2}{-2\sigma_{Jj}^2}\right]}{\sum_{J=1}^{M} \prod_{j=1}^{N} a_{Jj} \exp\left[\frac{(x_{ij} - m_{Jj})^2}{-2\sigma_{Jj}^2}\right]},$$

where $f(x_i)$ represents an occurrence probability of the i-th target landslide sample, $m_{Jj}$ represents a Gaussian distribution average value of a j-th candidate influence factor of the candidate influence factors under a J-th fuzzy reasoning criterion of the fuzzy reasoning criterions, $\sigma_{Jj}^2$ represents a variance of the j-th candidate influence factor of the candidate influence factors under the J-th fuzzy reasoning criterion, N represents the number of landslide samples of the model construction sample group, M represents a total number of the fuzzy reasoning criterions, $b_{Ji} x_i$ represents a back key of Gaussian distribution, $a_{Jj}$ represents a constant term in a Gaussian membership function, and $x_{ij}$ represents the i-th target landslide sample under the j-th candidate influence factor.

In an embodiment, the determining a start-up source region of the landslide chain disaster according to the model verification sample group and the occurrence probability of landslide chain disaster induced by heavy rain of each of the spatial positions in the observation site includes:

determining landslide start-up probability thresholds according to the model verification sample group and the occurrence probability of landslide chain disaster induced by heavy rain of each of spatial positions in the observation site, and obtaining accuracy rates of the landslide start-up probability thresholds to determine an optimal landslide start-up probability threshold; and determining a grid corresponding to each spatial position having an occurrence probability being greater than the optimal landslide start-up probability threshold as the start-up landslide source region of the landslide chain disaster.

In an embodiment, the determining an affected region of the landslide chain disaster in the observation site according to the start-up landslide source region of the landslide chain disaster includes:

obtaining start-up landslide source region distribution data and digital elevation model distribution data of the start-up landslide source region of the landslide chain disaster;

determining predicted landslide movement paths and predicted landslide rush-out distances according to the start-up landslide source region distribution data, the digital elevation model distribution data, and a landslide evolution model; and verifying the predicted landslide movement paths and the predicted landslide rush-out distances by using the model test sample group, to determine an optimal landslide movement path and an optimal landslide rush-out distance and thus to obtain the affected region of the landslide chain disaster.

In an embodiment, the determining a personnel number exposed to the landslide chain disaster according to the affected region of the landslide chain disaster and the personnel traffic distribution data includes:

performing spatially superposing on the affected region of the landslide chain disaster and the personnel traffic distribution data to obtain a casualty prediction region;

simulating and identifying in real time population distribution in the casualty prediction region under different rainstorm scenarios based on the casualty prediction region; and determining the personnel number exposed to landslide chain disaster according to the population distribution.

In an embodiment, the setting an event division threshold, and evaluating the number of casualties caused by the landslide chain disaster according to the event division threshold and the personnel number exposed to the landslide chain disaster includes:

setting the event division threshold;

determining a casualty probability caused by the landslide chain disaster; and classifying the landslide chain disaster with casualty probability being greater than the event division threshold as a casualty event; and evaluating the number of casualties caused by the landslide chain disaster based on the personnel number exposed to the landslide chain disaster and the casualty event.

In an embodiment, the method for evaluating casualty caused by landslide chain disaster induced by heavy rain further includes applying the number of casualties caused by the landslide chain disaster in early warning of the landslide chain disaster in the observation site.

In a second aspect, a system for evaluating casualty caused by landslide chain disaster induced by heavy rain is provided, the system is configured to the method for evaluating casualty caused by landslide chain disaster induced by heavy rain described-above and includes:

a data obtaining module, configured to obtain the historical landslide data, the candidate influence factors and the personnel traffic distribution data of the observation site;

a data processing module, connected to the data obtaining module and configured to evaluate the number of casualties caused by the landslide chain disaster according to the historical landslide data, the candidate influence factors and the personnel traffic distribution data of the observation site;

a data storage module, connected to the data processing module and configured to store data in the data processing module; and a data output module, connected to the data processing module and the data storage module, and configured to output data in the data processing module and the data storage module.

Compared with the related art, the disclosure may have at least the following beneficial effects. In the disclosure, when the affected region of the landslide chain disaster is obtained, not only the starting point of the landslide chain disaster is considered, but also the optimal landslide movement path and the optimal landslide rush-out distance are considered, so that the determined affected region of the landslide chain disaster has extremely high accuracy and reliability, and the accuracy of evaluating the number of casualties is improved. Further, when evaluating the number of casualties according to the affected region of the landslide chain disaster and the personnel traffic distribution data, the possibility of landslide chain disaster and the possibility of casualties are considered, which can accurately obtain the actual casualties caused by rainstorm-induced landslide chain disaster, realize the intelligent evaluation of the number of casualties caused by landslide chain disaster induced by heavy rain, provide reference for avoiding danger and rescuing in disaster regions, and help to protect people's safety and health and reduce property losses.

DETAILED DESCRIPTION OF EMBODIMENTS

Technical solutions of the disclosure will be further explained with reference to the accompanying drawings.

Figure 1:
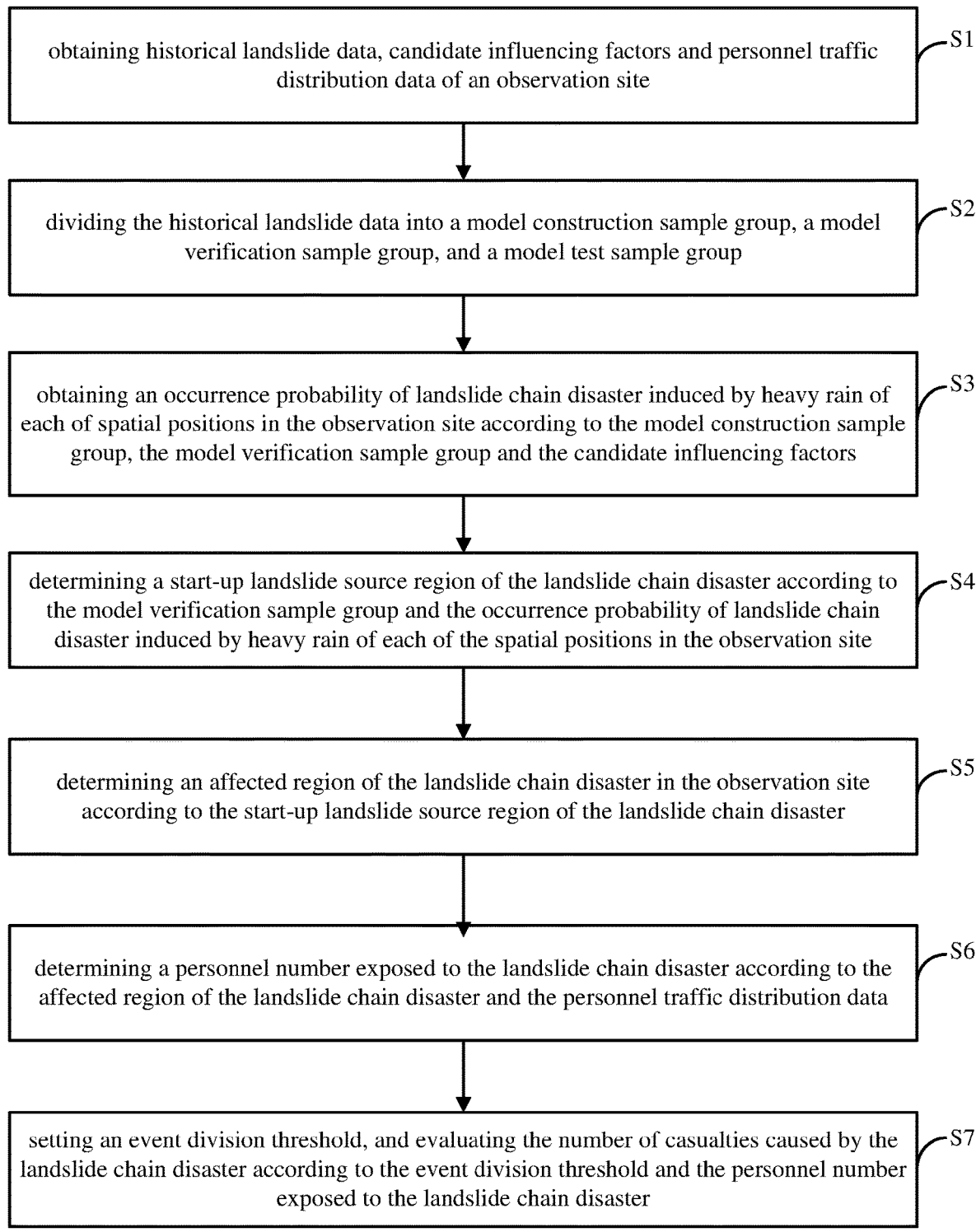
FIG. 1 illustrates is a flow chart of a method for evaluating casualty caused by landslide chain disaster induced by heavy rain according to an embodiment of the disclosure.

As illustrated in FIG. 1, a method for evaluating casualty caused by landslide chain disaster induced by heavy rain is shown and includes the following steps S1 to S7.

In step S1, historical landslide data, candidate influence factors and personnel traffic distribution data of an observation site are obtained.

Specifically, in an embodiment, historical landslide data can be downloaded from a geological disaster database of a location of the observation site. The candidate influence factors include a terrain slope, a terrain relief amplitude, a terrain curvature, a terrain position, a terrain humidity index, a heavy rain spatial distribution, a lithology type, a soil type, a vegetation coverage, a water system density, and a road density, and the candidate influence factors are obtained through field measurement of the observation site. The personnel traffic distribution data are obtained through statistics.

Further, a data volume of the historical landslide data should not be too large, so as to improve the speed and accuracy of determining a region affected by landslide chain disaster induced by heavy rain.

Further, in other alternative embodiments, the historical landslide data and the candidate influence factors can also be obtained through other manners. The candidate influence factors can also include other factors, such as the number of a traffic personnel, and time. Moreover, an influence degree of each candidate influence factor on landslide should be considered in advance when selecting the candidate influence factors, so as to reduce unnecessary calculation and improve the speed of determining the region affected by landslide chain disaster induced by heavy rain.

In step S2, the historical landslide data is divided into a model construction sample group, a model verification sample group, and a model test sample group.

Specifically, in an embodiment, step S2 may include the following steps S21 and S22.

In step S21, the historical landslide data is sorted.

In step S22, the historical landslide data is divided into the model construction sample group, the model verification sample group and the model test sample group according to a ratio of 7:2:1 between the model construction sample group:the model verification sample group:the model test sample group.

In step S3, an occurrence probability of landslide chain disaster induced by heavy rain of each of spatial positions in the observation site is obtained according to the model construction sample group, the model verification sample group and the candidate influence factors.

Specifically, in an embodiment, step S3 may include the following steps S31, S32, and S33.

In step S31, landslide source regions of landslide regions of the model construction sample group is obtained.

Specifically, in an embodiment, step S31 may include the following steps S311 and S312.

In step S311, shapes and topographic features of the landslide regions are determined.

In step S312, the landslide source regions are determined according to the shapes and the topographic features of the landslide regions.

Specifically, in this embodiment, the landslide source region is a landslide start-up region, and the shape and the topographic feature of the landslide region are determined by image recognition technology, and the landslide start-up region can be determined according to the shape and the topographic feature of the landslide region, so that the determining efficiency of the landslide source region is improved.

Further, in other alternative embodiments, the shape and the topographic feature of the landslide region can also be determined by other manners, so as to determine the landslide source region.

In step S32, a landslide start-up probability model is constructed according to the landslide source regions and the candidate influence factors.

In this embodiment, the landslide start-up probability model is established by a Takagi-Sugeno fuzzy reasoning method, and step S32 includes the following steps S321 to S325.

In step S321, an Euclidean distance between a target landslide sample group (i.e., the model verification sample group) and the model construction sample group is determined to obtain multiple neighboring data, and a formula of the Euclidean distance is expressed as follows:

$$\|x-y\| = \sqrt{\frac{\sum_{i=1}^{L}(x_i - y_i)^2}{L}},$$

where $\|x-y\|$ represents the Euclidean distance, L represents a total number of landslide samples of the model construction sample group, $x_i$ represents an i-th target landslide sample of the target landslide sample group, and $y_i$ represents an i-th landslide sample of the model construction sample group.

In step S322, a neighboring distance between the target landslide sample group and the multiple neighboring data is determined, and the neighboring distance is expressed as follows:

$$D=[D_1,D_2,\ldots,D_n],$$

where D represents the neighboring distance, $D_1$ represents an Euclidean distance between a first model verification sample of the model verification sample group and the model construction sample group, $D_2$ represents an Euclidean distance between a second model verification sample of the model verification sample group and the model construction sample group, and $D_n$ represents an Euclidean distance between an n-th model verification sample of the model verification sample group and the model construction sample group.

In step S323, a weight of each landslide sample of the model construction sample group to the target landslide sample group is determined according to the neighboring distance, and a formula of the weight is expressed as follows:

$$w_i=1-(D_i-\min(D)), i=1,2,\ldots,n,$$

where $w_i$ represents the weight, and $D_i$ represents an i-th neighboring distance.

In Step 324, fuzzy reasoning criterions are constructed according to the weight of each landslide sample to the target landslide sample group.

In step S325, the landslide start-up probability model is constructed according to the fuzzy reasoning criterions, and a formula of the landslide start-up probability model is expressed as follows:

$$f(x_i) = \frac{\sum_{J=1}^{M}\sum_{i=0}^{N}b_{Ji}x_i\prod_{j=1}^{N}a_{Jj}\exp\left[\frac{(x_{ij}-m_{Jj})^2}{-2\sigma_{Jj}^2}\right]}{\sum_{J=1}^{M}\prod_{j=1}^{N}a_{Jj}\exp\left[\frac{(x_{ij}-m_{Jj})^2}{-2\sigma_{Jj}^2}\right]},$$

where $f(x_i)$ represents an occurrence probability of the i-th target landslide sample, $m_{Jj}$ represents a Gaussian distribution average value of a j-th candidate influence factor of the candidate influence factors under a J-th fuzzy reasoning criterion of the fuzzy reasoning criterions, $\sigma_{Jj}^2$ represents a variance of the j-th candidate influence factor of the candidate influence factors under the J-th fuzzy reasoning criterion, N represents the number of landslide samples of the model construction sample group, M represents a total number of the fuzzy reasoning criterions, $b_{Ji}x_i$ represents a back key of Gaussian distribution, $a_{Jj}$ represents a constant term in a Gaussian membership function, and $x_{ij}$ represents the i-th target landslide sample under the j-th candidate influence factor.

Specifically, in this embodiment, the total number of the fuzzy reasoning criterions is based on the total number of candidate influence factors, which is beneficial to considering the influence of all candidate influence factors on the landslide chain disaster and obtaining a more accurate landslide start-up probability model.

In step S33, the occurrence probability of the landslide chain disaster induced by heavy rain of each of the spatial positions in the observation site is determined according to the landslide start-up probability model.

In step S4, a start-up landslide source region of the landslide chain disaster is determined according to the model verification sample group and the occurrence probability of landslide chain disaster induced by heavy rain of each of the spatial positions in the observation site.

Specifically, in an embodiment, step S4 includes the following steps S41 and S42.

In step S41, landslide start-up probability thresholds are determined according to the model verification sample group and the occurrence probability of landslide chain disaster induced by heavy rain of each of spatial positions in the observation site, and accuracy rates of the landslide start-up probability thresholds are obtained to determine an optimal landslide start-up probability threshold.

Specifically, in this embodiment, based the model verification sample data, the occurrence probability in step S33 is calculated iteratively based on the trial and error method to obtain multiple landslide start-up probability thresholds. If the calculated occurrence probability is greater than each of the multiple landslide start-up probability thresholds, the landslide will definitely occur, and if the calculated occurrence probability is less than each of the multiple landslide start-up probability thresholds, the landslide will not occur.

Further, based on the model verification sample group and the multiple landslide start-up probability thresholds, the number of actually occurred landslides and the number of determined landslides based on the multiple landslide start-up probability thresholds are counted, and the accuracy of each of the multiple landslide start-up probability thresholds is calculated to obtain the optimal landslide start-up probability threshold, and the accuracy is a ratio of the number of determined landslides according to the model verification sample group and the multiple landslide start-up probability thresholds to an actual number of landslides in the model verification sample group.

In step S42, a grid corresponding to each spatial position having an occurrence probability being greater than the optimal landslide start-up probability threshold is determined as the start-up landslide source region of the landslide chain disaster.

Specifically, in this embodiment, the grid corresponding to each spatial position having an occurrence probability being greater than the optimal landslide start-up probability threshold in the model verification sample group is determined as the start-up landslide source region of landslide chain disaster.

In step S5, an affected region of the landslide chain disaster in the observation site is determined according to the start-up landslide source region of landslide chain disaster.

Specifically, in an embodiment, step S5 may include the following steps S51 to S53.

In step S51, start-up landslide source region distribution data and digital elevation model distribution data of the start-up landslide source region of landslide chain disaster are obtained.

Specifically, in this embodiment, the start-up landslide source region distribution data is a geographical position of each start-up landslide source region of landslide chain disaster, and the obtaining of the digital elevation model data can refer to the related art, which is not limited herein.

Further, the digital elevation model data includes an elevation, a slope, a slope length and a slope orientation of each start-up landslide source region of landslide chain disaster, which can accurately reflect a topographic feature of each start-up landslide source region of landslide chain disaster in combination with the start-up landslide source region distribution data, and is beneficial to obtaining the accurate affected region of the landslide chain disaster.

In step S52, predicted landslide movement paths and predicted landslide rush-out distances are determined according to the start-up landslide source region distribution data, and the digital elevation model distribution data, and a landslide evolution model.

Specifically, in this embodiment, the start-up landslide source region distribution data and the digital elevation model distribution data of the start-up landslide source region of landslide chain disaster are jointly input into an infinite slope stability model, and possible landslide movement paths and possible landslide rush-out distances are simulated by using the infinite slope stability evolution model under the position and the topographic feature of the start-up landslide source region of landslide chain disaster, so as to obtain the predicted landslide movement paths and the predicted landslide rush-out distances.

In step S53, the predicted landslide movement paths and the predicted landslide rush-out distances are verified by using the model test sample group, to determine an optimal landslide movement path and an optimal landslide rush-out distance and thus to obtain the affected region of the landslide chain disaster.

Specifically, in this embodiment, predicted landslide rush-out affected regions after start-up of landslide disaster can be determined according to the predicted landslide movement paths and the predicted landslide rush-out distances, and a primary affected region of the landslide chain disaster can be determined by combining the predicted landslide rush-out affected regions with the start-up landslide source region of landslide chain disaster, and the primary affected region of the landslide chain disaster is mutually verified with an actual landslide range of the model test sample group to determine the optimal landslide movement path and the optimal landslide rush-out distance.

Further, an optimal landslide rush-out affected region can be simulated by using the optimal landslide movement path and the optimal landslide rush-out distance, and the affected region of the landslide chain disaster can be obtained by combining the optimal landslide rush-out affected region with the start-up landslide source region of landslide chain disaster. The affected region of the landslide chain disaster is a landslide influence range obtained according to the combination of the optimal landslide rush-out affected region and the start-up landslide source region of landslide chain disaster, which has high accuracy and reliability.

In step S6, a personnel number exposed to the landslide chain disaster is determined according to the affected region of the landslide chain disaster and the personnel traffic distribution data.

Specifically, in an embodiment, step S6 may include the following steps S61 to S63.

In step S61, spatially superposing is performed on the affected region of the landslide chain disaster and the personnel traffic distribution data to obtain a casualty prediction region.

Specifically, in this embodiment, the casualty prediction region is an overlapping region between the affected region of the landslide chain disaster and the personnel traffic distribution data, and the casualty prediction region is more than one in number.

In step S62, population distribution in the casualty prediction region is in real time simulated and identified under different rainstorm scenarios based on the casualty prediction region.

In step S63, the personnel number exposed to landslide chain disaster is determined according to the population distribution.

Specifically, in this embodiment, the personnel number exposed to landslide chain disaster is population distribution number in the casualty prediction region.

In step S7, an event division threshold is set, and the number of casualties caused by the landslide chain disaster is evaluated according to the event division threshold and the personnel number exposed to the landslide chain disaster.

Specifically, in an embodiment, step S7 may include the following steps S71, S72, and S73.

In step S71, the event division threshold is set.

Specifically, in this embodiment, for a certain landslide chain disaster, even if the personnel number exposed to landslide chain disaster is known, it is still uncertain whether casualties is caused, and the possibility of casualties caused by the certain landslide chain disaster should be considered, so the event division threshold can be set to divide each landslide chain disaster event. If a probability of casualties caused by the certain landslide chain disaster is greater than the event division threshold, it is determined that the certain landslide chain disaster will definitely lead to casualties.

Further, the event division threshold depends on the personnel traffic distribution of the observation site, and the more and denser the personnel traffic distribution, the lower the event division threshold.

In step S72, a casualty probability caused by the landslide chain disaster is determined, and a landslide chain disaster with casualty probability being greater than the event division threshold is classify as a casualty event.

Specifically, in this embodiment, the casualty probability is determined by a formula expressed as follows:

$$P = f(x_i) \times \tau,$$

where P represents the casualty probability, and r represents an event division factor.

Further, if a certain landslide region has caused casualties in the first three landslides, the event division factor is 1, otherwise it is 0.

Further, in other alternative embodiments, the casualty probability caused by landslide chain disaster can also be calculated by other methods.

In step S73, the number of casualties caused by the landslide chain disaster is evaluated based on the personnel number exposed to the landslide chain disaster and the casualty event.

Specifically, in this embodiment, a sum of the personnel number exposed to landslide chain disaster corresponding to each casualty event is the number of casualties caused by the landslide chain disaster.

Moreover, the method for evaluating casualty caused by landslide chain disaster induced by heavy rain further includes the method for evaluating casualty caused by landslide chain disaster induced by heavy rain further includes applying the number of casualties caused by the landslide chain disaster in early warning of the landslide chain disaster in the observation site. Specifically, the applying may include: providing the number of casualties caused by the landslide chain disaster to personnel in the observation site to avoid danger, and providing the number of casualties caused by the landslide chain disaster to a rescuer to rescue the personnel in the observation site.

Further, in an embodiment, the method for evaluating casualty caused by landslide chain disaster induced by heavy rain is implemented by a system for evaluating casualty caused by landslide chain disaster induced by heavy rain, and the system includes a processor and a memory with an evaluating application stored therein. The evaluating application, when executed by the processor, is configured to implement the method for evaluating casualty caused by landslide chain disaster induced by heavy rain and is further configured to send, over the Internet, the number of casualties caused by the landslide chain disaster to a mobile terminal of personnel in the observation site, and/or a mobile terminal of a rescuer. An application installed in the mobile terminal is configured to receive the number of casualties caused by the landslide chain disaster, and display the number of casualties caused by the landslide chain disaster on the mobile terminal to remind the personnel to avoid danger/remind the rescuer to rescue the personnel.

It should be noted that in some cases, the actions described in the specification can be performed in different orders and still achieve the desired results. In this embodiment, the sequence of steps is only given to make the embodiment more clear and convenient to explain, but not to limit it.

Figure 2:
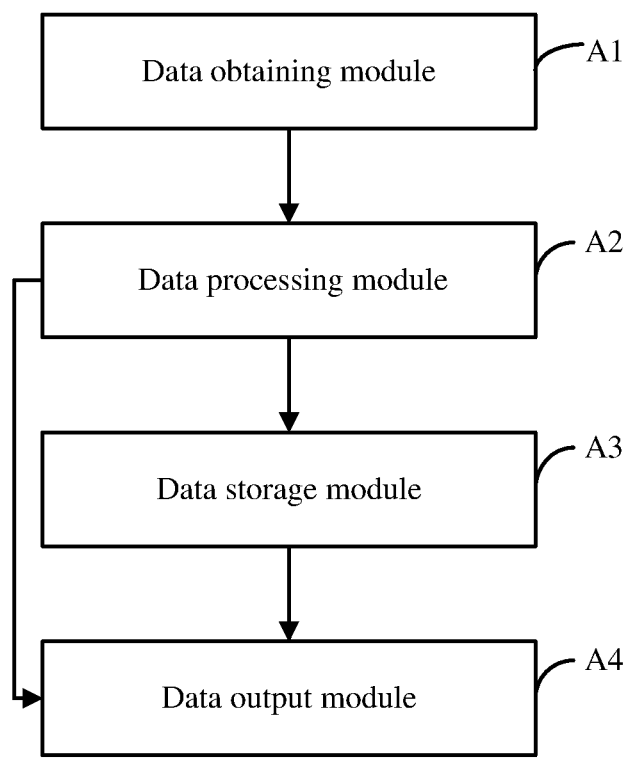
FIG. 2 is a schematic view of a system for evaluating casualty caused by landslide chain disaster induced by heavy rain according to an embodiment of the disclosure.

Referring to FIG. 2, in an alternative embodiment, the present invention also provides a system for evaluating casualty caused by landslide chain disaster induced by heavy rain. The system includes a data obtaining module A1, a data processing module A2, a data storage module A3, and a data output module A4.

The data obtaining module A1 is configured to obtain historical landslide data, candidate influence factors and personnel traffic distribution data of an observation site.

The data processing module A2 is connected to the data obtaining module A1. The data processing module A2 is configured to: divide the historical landslide data into a model construction sample group, a model verification sample group and a model test sample group according to a ratio of 7:2:1 between the model construction sample group: the model verification sample group:the model test sample group, construct a landslide start-up probability model according to the landslide source region and the candidate influence factors, determine an occurrence probability of landslide chain disaster induced by heavy rain of each of the spatial positions in the observation site according to the landslide start-up probability model, determine a start-up landslide source region of landslide chain disaster using the model verification sample group and the occurrence probability of landslide chain disaster induced by heavy rain of each of the spatial positions in the observation site, determine an affected region of the landslide chain disaster in the observation site according to the start-up landslide source region of landslide chain disaster, and the number of casualties caused by the landslide chain disaster induced by heavy rain is obtained through simulation analysis of the affected region of the landslide chain disaster and the personnel traffic distribution data.

The data storage module A3 is connected to the data processing module A2, and the data storage module A3 is configured to store data in the data processing module A2.

The data output module A4 is connected to the data processing module A2 and the data storage module A3, and is configured to output data in the data processing module A2 and the data storage module A3.

What is claimed is:

1. A method for evaluating casualty caused by landslide chain disaster induced by heavy rain, comprising:
   obtaining historical landslide data, candidate influence factors and personnel traffic distribution data of an observation site;
   dividing the historical landslide data into a model construction sample group, a model verification sample group, and a model test sample group;
   obtaining an occurrence probability of landslide chain disaster induced by heavy rain of each of spatial positions in the observation site according to the model construction sample group, the model verification sample group and the candidate influence factors;
   determining a start-up landslide source region of the landslide chain disaster according to the model verification sample group and the occurrence probability of landslide chain disaster induced by heavy rain of each of the spatial positions in the observation site;
   determining an affected region of the landslide chain disaster in the observation site according to the start-up landslide source region of the landslide chain disaster;
   determining a personnel number exposed to the landslide chain disaster according to the affected region of the landslide chain disaster and the personnel traffic distribution data; and
   setting an event division threshold, and evaluating the number of casualties caused by the landslide chain disaster according to the event division threshold and the personnel number exposed to the landslide chain disaster;
   wherein the method for evaluating casualty caused by landslide chain disaster induced by heavy rain further comprises:
      applying the number of casualties caused by the landslide chain disaster in early warning of the landslide chain disaster in the observation site; and sending, by a processor, the number of casualties caused by the landslide chain disaster to a mobile terminal of personnel in the observation site, and a mobile terminal of a rescuer, to make an application installed in the mobile terminal of the personnel to receive the number of casualties caused by the landslide chain disaster, and display the number of casualties caused by the landslide chain disaster on the mobile terminal of the personnel to remind the personnel to avoid danger, and to make an application installed in the mobile terminal of the rescuer to receive the number of casualties caused by the landslide chain disaster, and display the number of casualties caused by the landslide chain disaster on the mobile terminal of the rescuer to remind the rescuer to rescue the personnel.

2. The method for evaluating casualty caused by landslide chain disaster induced by heavy rain as claimed in claim 1, wherein the candidate influence factors comprises a terrain slope, a terrain relief amplitude, a terrain curvature, a terrain position, a terrain humidity index, a heavy rain spatial distribution, a lithology type, a soil type, a vegetation coverage, a water system density, and a road density;
  wherein the obtaining an occurrence probability of landslide chain disaster induced by heavy rain of each of spatial positions in the observation site according to the model construction sample group, the model verification sample group and the candidate influence factors comprises:
    obtaining landslide source regions of landslide regions of the model construction sample group;
    constructing a landslide start-up probability model according to the landslide source regions and the candidate influence factors; and
    determining the occurrence probability of landslide chain disaster induced by heavy rain of each of the spatial positions in the observation site according to the landslide start-up probability model.

3. The method for evaluating casualty caused by landslide chain disaster induced by heavy rain as claimed in claim 2, wherein the obtaining landslide source regions of landslide regions of the model construction sample group comprises:
  determining shapes and topographic features of the landslide regions; and
  determining the landslide source regions according to the shapes and the topographic features of the landslide regions.

4. The method for evaluating casualty caused by landslide chain disaster induced by heavy rain as claimed in claim 2, wherein the constructing a landslide start-up probability model according to the landslide source regions and the candidate influence factors comprises:
  determining an Euclidean distance between a target landslide sample group and each landslide sample in the historical landslide data to obtain a plurality of neighboring data, and a formula of the Euclidean distance is expressed as follows:

$$\|x-y\| = \sqrt{\frac{\sum_{i=1}^{L}(x_i - y_i)^2}{L}},$$

where $\|x-y\|$ represents the Euclidean distance, L represents a total number of landslide samples of the model construction sample group, $x_i$ represents an i-th target landslide sample of the target landslide sample group, and $y_i$ represents an i-th landslide sample of the model construction sample group;
  determining a neighboring distance between the target landslide sample group and the plurality of neighboring data, wherein the neighboring distance is expressed as follows:

$D=[D_1,D_2, \ldots ,D_n]$, where D represents the neighboring distance;
  determining a weight of each landslide sample of the model construction sample group to the target landslide sample group is determined according to the neighboring distance, wherein a formula of the weight is expressed as follows:

$w_i=1-(D_i-\min(D))$, $i=1,2, \ldots ,n$, where $w_i$ represents the weight, and D represents an i-th neighboring distance;
  constructing fuzzy reasoning criterions according to the weight of each landslide sample to the target landslide sample group; and constructing the landslide start-up probability model according to the fuzzy reasoning criterions, wherein a formula of the landslide start-up probability model is expressed as follows:

$$f(x_i) = \frac{\sum_{J=1}^{M}\sum_{i=0}^{N} b_{Ji}x_i \prod_{j=1}^{N} a_{Jj}\exp\left[\frac{(x_{ij} - m_{Jj})^2}{-2\sigma_{Jj}^2}\right]}{\sum_{J=1}^{M} \prod_{j=1}^{N} a_{Jj}\exp\left[\frac{(x_{ij} - m_{Jj})^2}{-2\sigma_{Jj}^2}\right]},$$

where $f(x_i)$ represents an occurrence probability of the i-th target landslide sample, $m_{Jj}$ represents a Gaussian distribution average value of a j-th candidate influence factor of the candidate influence factors under a J-th fuzzy reasoning criterion of the fuzzy reasoning criterions, $\sigma_{Jj}^2$ represents a variance of the j-th candidate influence factor of the candidate influence factors under the J-th fuzzy reasoning criterion, N represents the number of the landslide samples, M represents a total number of the fuzzy reasoning criterions, $b_{Ji}x_i$ represents a back key of Gaussian distribution, $a_{Jj}$ represents a constant term in a Gaussian membership function, and $x_{ij}$ represents the i-th target landslide sample under the j-th candidate influence factor.

5. The method for evaluating casualty caused by landslide chain disaster induced by heavy rain as claimed in claim 1, wherein the determining a start-up landslide source region of the landslide chain disaster according to the model verification sample group and the occurrence probability of landslide chain disaster induced by heavy rain of each of the spatial positions in the observation site comprises:
  determining landslide start-up probability thresholds according to the model verification sample group and the occurrence probability of landslide chain disaster induced by heavy rain of each of spatial positions in the observation site, and obtaining accuracy rates of the landslide start-up probability thresholds to determine an optimal landslide start-up probability threshold; and
  determining a grid corresponding to each spatial position having an occurrence probability being greater than the optimal landslide start-up probability threshold as the start-up landslide source region.

6. The method for evaluating casualty caused by landslide chain disaster induced by heavy rain as claimed in claim 1, wherein the determining an affected region of the landslide chain disaster in the observation site according to the start-up landslide source region of the landslide chain disaster comprises:
  obtaining start-up landslide source region distribution data and digital elevation model distribution data of the start-up landslide source region;
  determining predicted landslide movement paths and predicted landslide rush-out distances according to the start-up landslide source region distribution data, the digital elevation model distribution data, and a landslide evolution model; and
  verifying the predicted landslide movement paths and the predicted landslide rush-out distances by using the model test sample group, to determine an optimal landslide movement path and an optimal landslide rush-out distance and thus to obtain the affected region of the landslide chain disaster.

7. The method for evaluating casualty caused by landslide chain disaster induced by heavy rain as claimed in claim 1, wherein the determining a personnel number exposed to the landslide chain disaster according to the affected region of the landslide chain disaster and the personnel traffic distribution data comprises:
- performing spatially superposing on the affected region of the landslide chain disaster and the personnel traffic distribution data to obtain a casualty prediction region;
- simulating and identifying in real time population distribution in the casualty prediction region under different rainstorm scenarios based on the casualty prediction region; and
- determining the personnel number exposed to landslide chain disaster according to the population distribution.

8. The method for evaluating casualty caused by landslide chain disaster induced by heavy rain as claimed in claim 1, wherein the setting an event division threshold, and evaluating the number of casualties caused by the landslide chain disaster according to the event division threshold and the personnel number exposed to the landslide chain disaster comprises:
- setting the event division threshold;
- determining a casualty probability caused by the landslide chain disaster; and classifying the landslide chain disaster with casualty probability being greater than the event division threshold as a casualty event; and
- evaluating the number of casualties caused by the landslide chain disaster based on the personnel number exposed to the landslide chain disaster and the casualty event.

9. The method for evaluating casualty caused by landslide chain disaster induced by heavy rain as claimed in claim 1, wherein the dividing the historical landslide data into a model construction sample group, a model verification sample group, and a model test sample group comprises:
- sorting the historical landslide data; and
- dividing the historical landslide data into the model construction sample group, the model verification sample group and the model test sample group according to a ratio of 7:2:1 between the model construction sample group:the model verification sample group:the model test sample group.

10. A method for evaluating casualty caused by landslide chain disaster induced by heavy rain, comprising:
- obtaining historical landslide data, candidate influence factors and personnel traffic distribution data of an observation site;
- dividing the historical landslide data into a model construction sample group, a model verification sample group, and a model test sample group;
- obtaining an occurrence probability of landslide chain disaster induced by heavy rain of each of spatial positions in the observation site according to the model construction sample group, the model verification sample group and the candidate influence factors;
- determining a start-up landslide source region of the landslide chain disaster according to the model verification sample group and the occurrence probability of landslide chain disaster induced by heavy rain of each of the spatial positions in the observation site;
- determining an affected region of the landslide chain disaster in the observation site according to the start-up landslide source region of the landslide chain disaster;
- determining a personnel number exposed to the landslide chain disaster according to the affected region of the landslide chain disaster and the personnel traffic distribution data;
- setting an event division threshold, and evaluating the number of casualties caused by the landslide chain disaster according to the event division threshold and the personnel number exposed to the landslide chain disaster; and
- providing the number of casualties caused by the landslide chain disaster to personnel in the observation site to avoid danger, and providing the number of casualties caused by the landslide chain disaster to a rescuer to rescue the personnel in the observation site.

11. A method for evaluating casualty caused by landslide chain disaster induced by heavy rain, implemented by a system comprising a processor and a memory with an evaluating application stored therein, and the method comprising:
- obtaining, by the processor, historical landslide data, candidate influence factors and personnel traffic distribution data of an observation site;
- dividing, by the processor, the historical landslide data into a model construction sample group, a model verification sample group, and a model test sample group;
- obtaining, by the processor, an occurrence probability of landslide chain disaster induced by heavy rain of each of spatial positions in the observation site according to the model construction sample group, the model verification sample group and the candidate influence factors;
- determining, by the processor, a start-up landslide source region of the landslide chain disaster according to the model verification sample group and the occurrence probability of landslide chain disaster induced by heavy rain of each of the spatial positions in the observation site;
- determining, by the processor, an affected region of the landslide chain disaster in the observation site according to the start-up landslide source region of the landslide chain disaster;
- determining, by the processor, a personnel number exposed to the landslide chain disaster according to the affected region of the landslide chain disaster and the personnel traffic distribution data;
- setting, by the processor, an event division threshold, and evaluating the number of casualties caused by the landslide chain disaster according to the event division threshold and the personnel number exposed to the landslide chain disaster; and
- sending, by the processor, the number of casualties caused by the landslide chain disaster over the Internet to a mobile terminal of personnel in the observation site, and a mobile terminal of a rescuer, thereby to make an application installed in the mobile terminal of the personnel to receive the number of casualties caused by the landslide chain disaster, and display the number of casualties caused by the landslide chain disaster on the mobile terminal of the personnel to remind the personnel to avoid danger, and to make an application installed in the mobile terminal of the rescuer to receive the number of casualties caused by the landslide chain disaster, and display the number of casualties caused by the landslide chain disaster on the mobile terminal of the rescuer to remind the rescuer to rescue the personnel.

* * * * *